(12) United States Patent
Day

(10) Patent No.: US 6,304,690 B1
(45) Date of Patent: Oct. 16, 2001

(54) CONNECTING A PLURALITY OF CIRCUIT BOARDS

(75) Inventor: Ian Edward Day, Oxford (GB)

(73) Assignee: Bookham Technology plc, Abingdon Oxfordshire (GB)

( * ) Notice: Subject to any disclaimer, the term of this patent is extended or adjusted under 35 U.S.C. 154(b) by 0 days.

(21) Appl. No.: 09/281,971

(22) Filed: Mar. 31, 1999

(30) Foreign Application Priority Data

Apr. 2, 1998 (GB) .................................................. 9807111

(51) Int. Cl.[7] .............................. G02B 6/293; G02B 6/36
(52) U.S. Cl. .................................. 385/24; 385/15; 385/53; 385/134
(58) Field of Search ................................ 385/14, 15, 24, 385/49, 50, 53, 88, 89, 134, 135, 144

(56) References Cited

U.S. PATENT DOCUMENTS

| | | | |
|---|---|---|---|
| 3,943,021 | * 3/1976 | Lindsey | 385/15 X |
| 4,061,577 | * 12/1977 | Bell | 385/15 X |
| 4,733,093 | * 3/1988 | Graves et al. | 250/551 |
| 5,155,785 | * 10/1992 | Holland et al. | 385/89 |
| 5,245,680 | * 9/1993 | Sauter | 385/24 |
| 5,355,237 | 10/1994 | Lang et al. | 359/130 |
| 5,487,120 | * 1/1996 | Choy et al. | 385/24 |
| 5,612,968 | 3/1997 | Zah | 372/50 |
| 5,793,919 | * 8/1998 | Payne et al. | 385/135 |
| 6,038,355 | * 3/2000 | Bishop | 385/14 |

FOREIGN PATENT DOCUMENTS

| | | |
|---|---|---|
| 0 501 751 A1 | 2/1992 | (EP) . |
| 0 593 287 A1 | 4/1994 | (EP) . |
| 0 756 185 A2 | 1/1997 | (EP) . |
| 0 758 799 A2 | 2/1997 | (EP) . |
| 2 245 080 A | 12/1991 | (GB) . |
| 2 315 595 A | 4/1998 | (GB) . |
| 5-48074 A | 2/1993 | (JP) . |

* cited by examiner

Primary Examiner—John D. Lee
(74) Attorney, Agent, or Firm—Fleshner & Kim, LLP

(57) ABSTRACT

Apparatus connecting electrical circuit boards (1, 2, 3, . . . N) so each board can communicate with each other. Each board has an optical circuit, which in turn has a transmitter module (T) and a receiver module (R). The transmitter module (T) has electrical to optical converters (11B) for converting electrical signals into optical signals, a wavelength multiplexer (12) for multiplexing the optical signals into a single optical waveguide (12A), and an optical splitter (13) for dividing the multiplexed signal into a plurality of identical signals for transmission to each of the receiver modules (R). The receiver module (R) has an optical selector (14) for selecting signals from the transmission modules (T), a wavelength demultiplexer (21) for demultiplexing the selected signal into signals each of a different wavelength ($\lambda_1 \ldots \lambda_n$), and optical to electrical converters (22B) for converting each of the signals of different wavelengths into an electrical signal.

30 Claims, 4 Drawing Sheets

CONNECTING A PLURALITY OF CIRCUIT BOARDS

TECHNICAL FIELD

This invention relates to apparatus for use in connecting a plurality of electrical circuit boards so each electrical circuit board can communicate with each other electrical circuit board.

BACKGROUND ART

Current switch fabrics employed in high bandwidth switches e.g. Asynchronous Transfer Mode switches and Synchronous Optical Networking Standards/Synchronous Digital Hierarchy SONET/SDH currently interconnect circuit boards via an electrical back plane. Where signals are required to be switched between circuit boards, an electrical switch fabric is also used, with all data paths routed via the back plane to the witch fabric. In order to increase the bandwidth of such systems, the capacity of the back planes and switch fabrics must be increased, with wider data paths and higher clock frequencies. Pin Counts, high clock frequencies and electromagnetic interference (EMI) make this problematic.

Optical back planes and switch fabrics offer the possibility of an architecture which is essentially independent of the bandwidth requirements placed upon it.

Such optical interconnects are discussed in the literature, e.g. BT Technol J Vol 9 No 4 1991, but all the work in this field has so far employed discrete optical components and the costs of fabricating prior art circuits has so far been prohibitive compared to the cost of the conventional electronic solution.

The present Invention aims to improve on this prior art and to provide optical apparatus for providing the required interconnection which is cost-effective when compared to the known electrical solutions.

DISCLOSURE OF INVENTION

According to the present invention, there is provided apparatus for use in connecting a plurality of electrical circuit boards so each electrical circuit board can communicate with each other electrical circuit board, the apparatus comprising an optical circuit for association with each electrical circuit board, each optical circuit comprising a transmitter module and a receiver module;

the transmitter module comprising:
  a plurality of electrical to optical converter means for converting a plurality of electrical signals into a plurality of optical signals each of a different wavelength,
  wavelength multiplexing means for multiplexing the optical signals of different wavelengths into a single optical waveguide, and
  optical splitter means for dividing the multiplexed signal in the single optical waveguide into a plurality of identical signals for transmission to each of the receiver modules; and the receiver module comprising:
  optical selecting means for selecting signals from one or more of the transmission modules;
  wavelength demultiplexing means for demultiplexing the selected signal or signals into a plurality of signals each of a different wavelength, and
  a plurality of optical to electrical converter means for converting each of the said plurality of signals of different wavelengths into an electrical signal, wherein the optical circuit comprises one or more integrated optical circuits providing:
  wavelength multiplexing means comprising integrated directing means for directing the plurality of optical signals of different wavelengths into a single integrated optical waveguide;
  optical splitter means comprising an integrated optical waveguide which successively divides into a plurality of integrated optical waveguides;
  optical selecting means comprising a plurality of integrated optical input waveguides leading to a single integrated output waveguide;
  wavelength demultiplexing means comprising an integrated transmission or reflection grating for directing signals of different wavelengths to respective optical to electronic converter means.

Preferred and optional features of the invention will be apparent from the following description and from the subsidiary claims of the specification.

BRIEF DESCRIPTION OF DRAWINGS

The invention will now be further described, merely by way of example, with reference to the accompanying drawings, in which.

BEST MODE OF CARRYING OUT THE INVENTION

Figure 1:
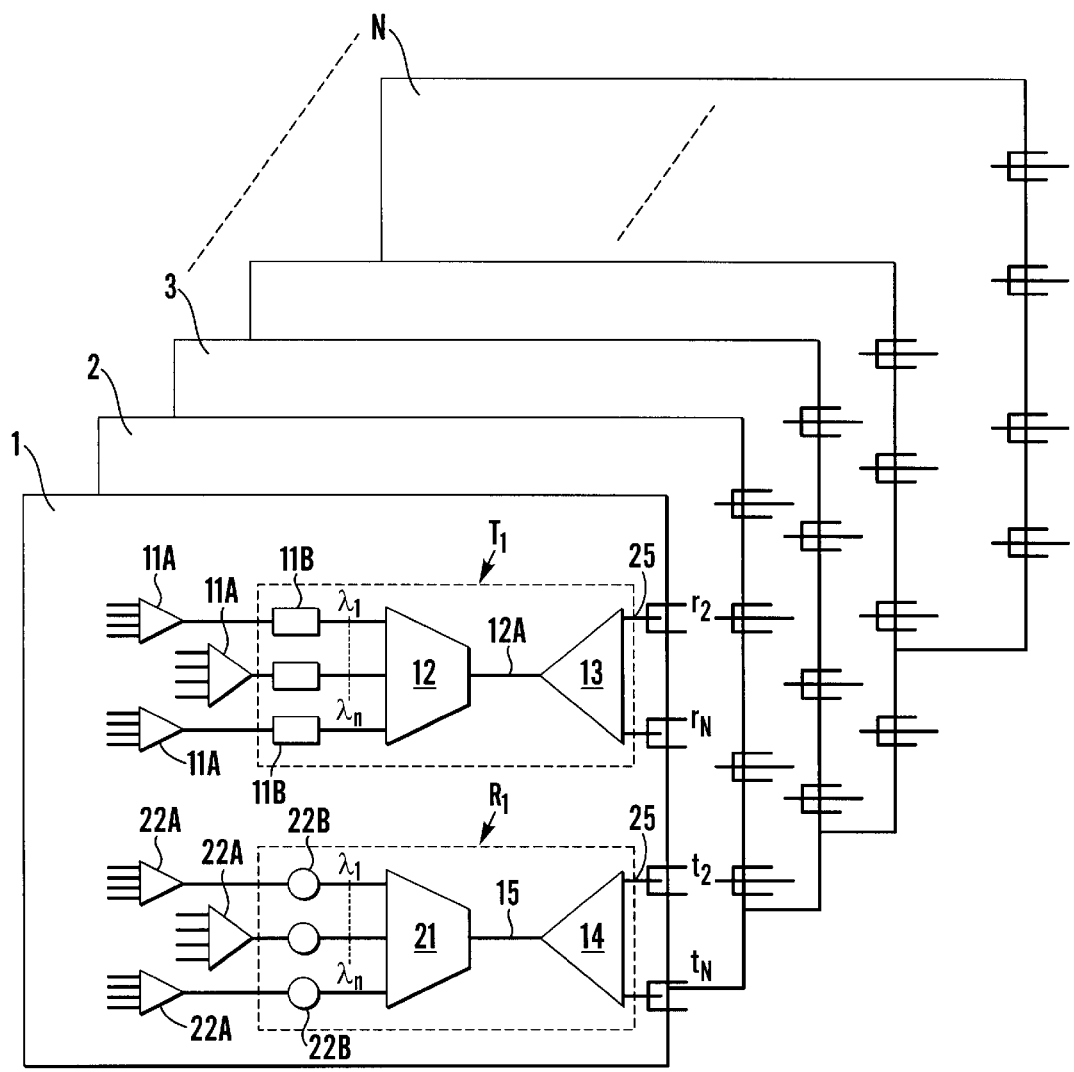
FIG. 1 is a schematic diagram of an optical switch fabric comprising apparatus according to a first embodiment of the invention.

FIG. 1 shows optical circuits for use in connecting N electrical circuit boards 1–N so that each electrical circuit board can communicate with each other electrical circuit board. The optical circuits each comprise a transmitter module $T_1$ and a receiver module $R_1$. The optical circus provided on the other electrical circuit boards 2–N similarly comprise transmitter modules $T_2$–$T_N$ and receiver modules $R_2$–$R_N$. The optical circuits are associated with the respective electrical circuit boards 2–N and may be mounted thereon as shown in FIG. 1.

The optical circuit boards preferably comprises one or more silicon-on-insulator (SOI) chips as will be discussed further below.

The transmitter module $T_1$ comprises electrical to optical converters which receive data from the first electrical circuit board 1 and convert the data into modulated optical signals. The electrical data is typically provided in parallel form and is converted to a serial data stream by electronic time division multiplexing (TDM) means 11A. The TDM means 11A may be provided on an electrical circuit board mounted separately or mounted on the optical circuit board or it may be integrated on the same chip as the integrated optical circuit. The serial data stream is then converted to an optical signal, e.g. by means of laser-diodes 11B which are preferably hybridised on the optical circuit. FIG. 1 shows three TDM means 11A and three photodiodes 11B but as many electrical to optical converters as required may be provided to convert the electrical signals received from the first electrical circuit board into optical signals. Typical arrangements may comprise up to five or ten converters but more could be provided, Each converter provides an optical signal of a different wavelength $\lambda_1 \ldots \lambda_n$.

U.S. Pat. No. 5,881,190 describes a method of hybridising a laser diode on an SOI chip and the disclosure thereof is incorporated herein.

The outputs of the converters are provided to a wavelength multiplexer 12 which comprises integrated directing means for directing the plurality of signals received from the converters into a single integrated waveguide 12A. In a simple arrangement the directing means may comprise a series of Y-junctions in the waveguides which successively combine the signals received from the converters. Such an arrangement of Y-junctions would be similar to that shown in FIG. 3 (discussed below) but operated in the opposite direction to combine rather than divide signals.

In a preferred arrangement, the wavelength multiplexer 12 comprises a transmission or reflection grating integrated in the optical circuit. Such a grating may be formed by a series of spaced apart features, e.g. recesses, etched in the silicon layer of an SOI chip. U.S. patent application Ser. No. 09/083,175 discloses a transceiver which incorporates such a grating and the disclosure thereof is incorporated herein.

The waveguide 12A leads to optical splitter means 13 which divides the wavelength multiplexed signal into a plurality, N−1, of identical signals for transmission to an optical back plane which transmits signals from the transmitter module $T_1$ to the receiver modules $R_2$ to $R_N$ associated with the other circuit boards 2 to N.

The outputs of the transmitter module $T_1$ are labelled $r_2$ to $r_N$ to indicate that the output $r_2$ is for connection to the receiver module $R_2$ associated with the second circuit board 2 through to the output $r_N$ being for connection to the receiver module $R_N$ associated with the circuit board N. Likewise, the inputs of the receiver module $R_1$ are labelled $t_2$ to $t_N$ to indicate that $t_2$ is connected to the transmitter module $T_2$ associated with circuit board 2 through to $t_N$ being connected to the transmitter module $T_N$ associated with circuit board N.

Figure 3:
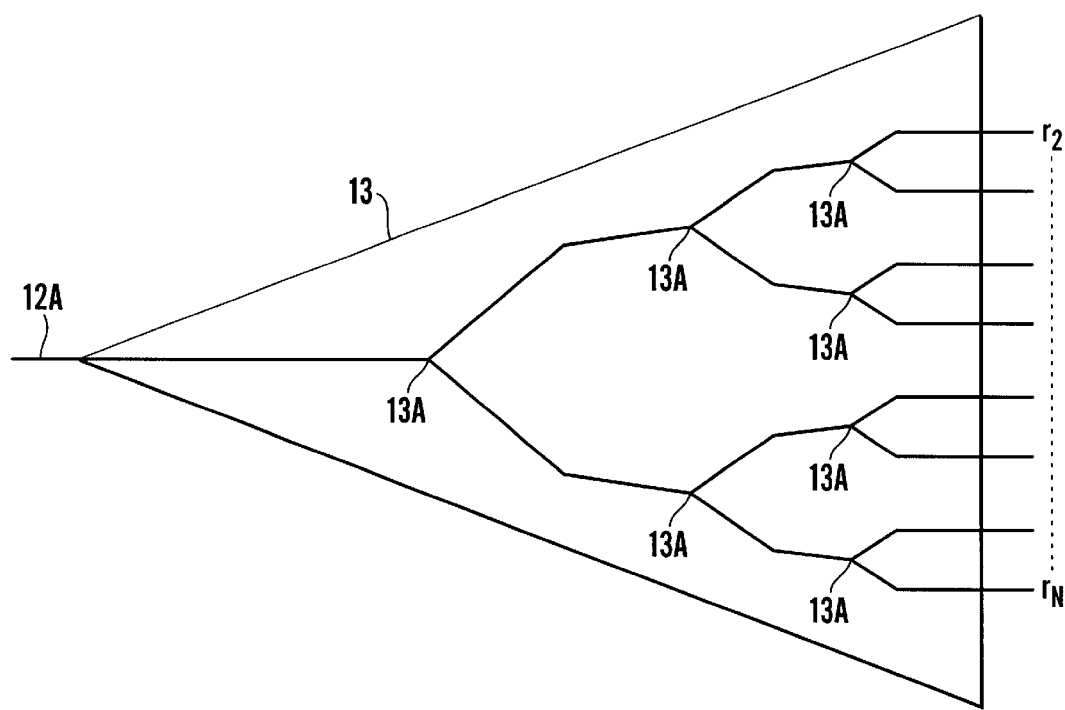
FIG. 3 is a schematic diagram of optical splitter means which may be used In either of the embodiments shown in FIGS. 1 and 2.

The optical splitter means 13 comprises an integrated optical waveguide which successively divides into a plurality, N−1, of integrated optical waveguides $r_2$ to $r_N$. FIG. 3 shows one form of such splinter means 13 in more detail. This comprises integrated optical waveguides which form a cascade of Y-junctions 13A which successively divide the signal into a plurality N−1 of identical signals, these being routed to the outputs $r_2$ to $r_N$.

The output of each transmitter module $T_1$ to $T_N$ is connected to an optical back plane as discussed in the BT reference mentioned above. Such an optical back plane may, for instance, simply comprise a plurality of optical fibres arranged to connect an output of each of the transmitter modules $T_1$ to $T_N$ to each of the receiver modules $R_1$ to $R_N$ except for those pairs of transmitter and receiver modules associated with the same electrical circuit board if each transmitter module provides N−1 identical outputs and there are N electrical circuit boards to interconnect (and hence N transmitter modules and N receiver modules), the optical back plane comprises a bundle of N×(N−1) optical fibres If the optical fibres are operated in a bidirectional mode, the number required is halved, i.e. N×(N−1)/2. This may be possible if the transmitter module $T_1$ and receiver module $R_1$ are combined in the form of a transceivers e.g. in the manner described in U.S. patent application Ser. No. 09/083,175 referred to above, or with the use of Y-junctions as described further below.

Each receiver module $R_1$ to $R_N$ comprises optical selecting means 14 for selecting a signal from one or more of the transmission modules $T_1$ to $T_N$ (via the optical back plane), the selecting means comprising a plurality of integrated optical input waveguides $t_2$ to $t_N$ leading to a single integrated output waveguide 15.

In one simple form, which would be feasible if N is relatively small, e.g. ten or less, the selecting means 14 may be arranged to permanently select the signals received on all input waveguides. In this case, the selecting means may simply comprise a series of Y-junctions which successively combine the input waveguides into a single output waveguide (similar to the simple form of directing means described above). Such an arrangement is possible if each wavelength used is uniquely assigned to a given pair of transmitter and receiver modules and in the process of wavelength demultiplexing (described below), each receiver module is arranged to disregard or dump signals not being of one of the wavelengths assigned to it and to then demultiplex the remaining signals to the appropriate outputs according to their wavelength. Another alternative, is to use time division multiplexing (described below) to distinguish between signals intended to be received by a given receiver module and those intended for other receiver modules.

In preferred arrangements, the selecting means 14 is provided with one or more optical switches so that the selecting means can be controlled to select which one (or more) signals from the input waveguides are combined onto the single output waveguide 15. The selecting means 14 may, therefore, comprise a combination of Y-junctions and optical switches.

Figure 4:
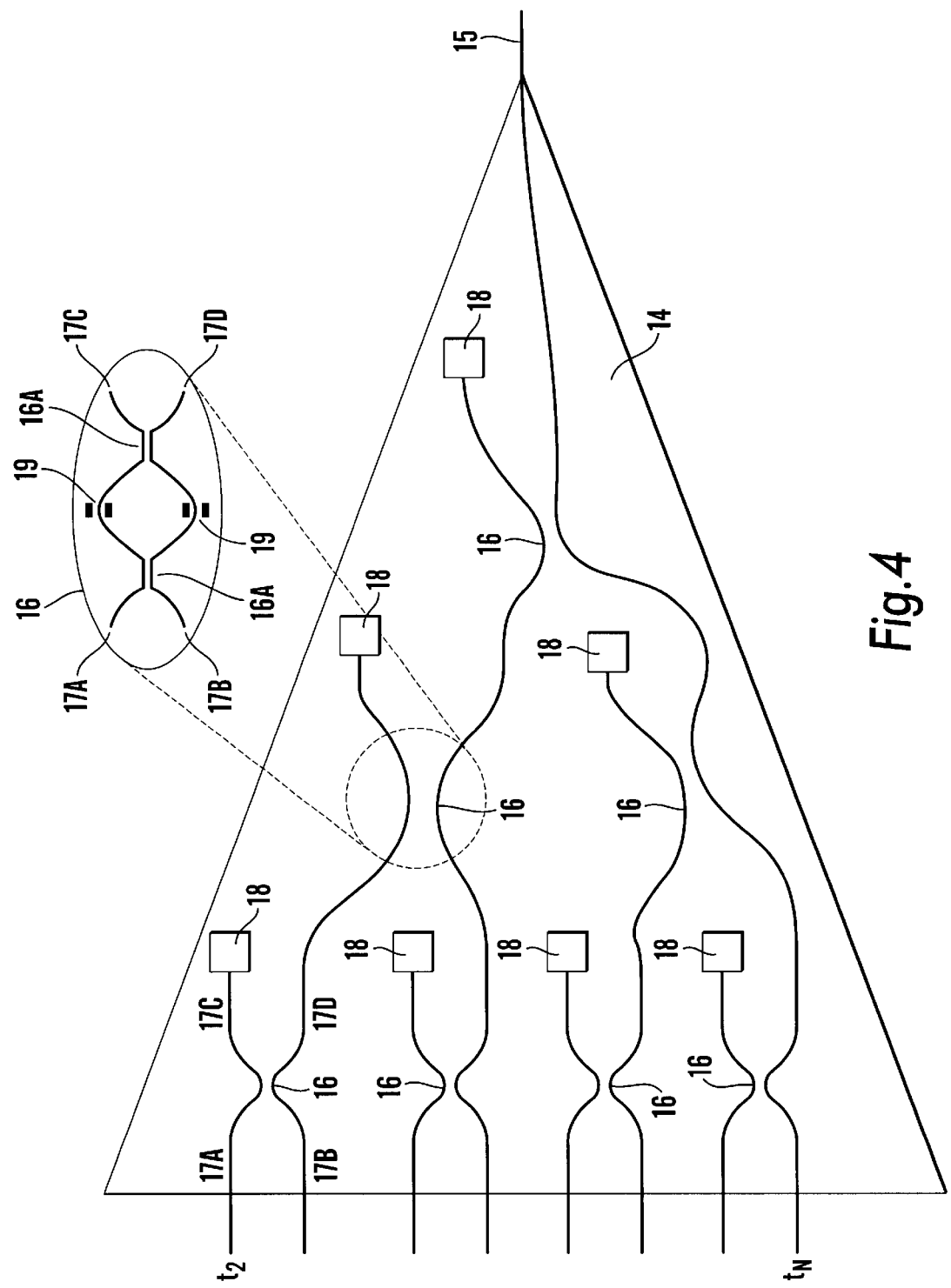
FIG. 4 is a schematic diagram of optical switching means which may be used in either of the embodiments shown in FIGS. 1 and 2.

FIG. 4 shows a form of the selecting means which provides maximum control over the selection of which input waveguides are in communication with the single output waveguide 15.

This form comprises an array of switches 16 which provide a communication path from each input $t_2$–$t_N$ thereto to the output waveguide 15. With appropriate control of each of the switches 16, the switching means can select which input waveguide or waveguides, and hence which transmission module(s) is or are connected to the output waveguide 15.

In the embodiment shown, each of the switches 16 comprises a cascaded Mach-Zehnder switch which comprises two evanescent couplers 16A with a Mach-Zehnder interferometer therebetween with a PIN diode phase modulator 19 provided on one or both arms of the interometer. This structure is shown enlarged for one of the switches 16 in FIG. 4 but would apply to all the switches 16. Each switch comprises four ports 17A, 17B, 17C and 17D and the switch is controlled by means of the modulator(s) 19 to connect input 17A to output 17C and input 17B to output 17D, or vice versa, or to connect both inputs to both outputs.

The output port 17D leads to the next switch 16 (or to waveguide 15 in the case of the last switch 16) and the other output port 17C leads to a beam dump 18 for absorbing light switched to that port. By appropriate control of the switches 16, any of the inputs $t_2$ to $t_N$, or any combination thereof, can be routed to the output waveguide 15. Further details of a PIN diode phase modulator are provided in U.S. Pat. No. 5,757,986 the disclosure of which is incorporated herein. Further details of an integrated beam dump are given in U.S. Ser. No. 09/095,817 (now U.S. Pat. No. 6,002,514) the disclosure of which is also incorporated herein.

Other types of modulators or other types of optical switch may also be used.

The output from the optical switching means 14 is transmitted by the waveguide 15 to wavelength demultiplexing means 21 for demultiplexing the signal into a plurality, n, of signals each of a different wavelength. The wavelength demultiplexer comprises a transmission or reflection grating integrated in the optical circuit and is similar to the grating described above in relation to the wavelength multiplexer 12. The demultiplexer provides n outputs each of a different wavelength. As described in U.S. patent application Ser. No. 09/083,175 referred to above, the transmission or diffraction grating divides the received signal into separate signals of different wavelengths and can be arranged to direct these signals to different integrated waveguides.

The n signals from the demultiplexer 21 are directed by these waveguides to a plurality, n, of optical to electrical converters to convert the optical signals into electrical signals, e.g. by means of photodiodes 22B, and then convert the serial data stream into a parallel data stream using time division demultiplexing means 22A, e.g provided on the electrical circuit board 1 in a similar manner to the TDM means 11A described above, which is then communicated to the associated electrical circuit board. The photodiodes 22B are preferably hybridised on the optical circuit U.S. Ser. No. 09/019,729 (now U.S. Pat. No. 6,108,472) discloses a method of hybridising a photodiode onto an SOI chip and the disclosure thereof is incorporated herein.

The arrangement shown in FIG. 1 is essentially an optical version of an electrical multicast switch fabric interconnect where every circuit board is connected to every other circuit board. The arrangement allows time, space and wavelength multiplexing to be used as required to achieve the maximum bandwidth. The number of time slots, wavelengths, fibres and circuit boards etc. will depend on the application and the technology used and could vary between one and thousands.

Electrical data, e.g. 32 bits wide at a clock frequency of 100 MHz, from an electrical circuit board, may be converted to serial data at 3.2 Gb/s (by Time Division Multiplexing). The serial data is converted to an optical signal at a given wavelength. A wavelength multiplexer 12 is used to combine multiple wavelengths onto a single waveguide 12A. The resulting signal is then split, and a fraction of the signal is routed to every other electrical circuit board via the optical back plane. An optical selector 14 selects one or more of the incoming signals, which are then wavelength demultiplexed, converted back to an electrical signal and parallelised, i.e. time division demultiplexed.

As described herein, this arrangement can be implemented using integrated optical circuits. The demultiplexer 21, and in some cases the multiplexer 21, comprise a transmission or reflection grating integrated on an optical circuit, the optical splitter 13 comprises an integrated optical waveguide which successively divides into a plurality of integrated optical waveguides and the optical selecting means 14 comprise a plurality of integrated Y-junctions and/or optical switches leading to a single integrated waveguide 15.

In preferred embodiments, other components may also be integrated on the optical circuit(s). In the arrangement shown in FIG. 1, and as described above, the electrical to optical converters may comprise laser diodes 11B hybridised onto the integrated chip and the optical to electrical converters may comprise photodiodes 22B hybridised on the integrated circuit. Furthermore, the connections 25 between the optical fibres of the optical back plane and the outputs of the splitter means 13 and the inputs of the switching means 14 may be provided by means of grooves formed in the integrated circuit to receive the optical fibres. One form of such a connection is described in U.S. Pat. No. 5,787,214 the disclosure of which is incorporated herein. U.S. patent application Ser. No. 09/057,642 (now U.S. Pat. No. 6,075,914) also describes an advantageous method of connecting an optical fibre to an Integrated waveguide and the disclosure thereof is also incorporated herein.

The components of the transmission module $T_1$ and those of the receiver module $R_1$ may be provided on the separate integrated optical circuits or they may be provided on the same integrated optical circuit. The transmission module $T_1$ and receiver module $R_1$ may also be combined as a transceiver as described above.

In another arrangement (not shown), the optical fibre connections between the respective transmitter modules and receiver modules may be bi-directional, e.g. a single fibre may be used to provide the connection between the output $r_2$ and the receiver module $R_2$ and between the input $t_2$ and the transmitter module $T_2$, in which case a Y-junction or other form of combining means would be provided on the optical circuit boards at each end of the fibre to provide communication between the fibre and both the respective optical splitter means 13 and optical selecting means 14.

Figure 2:
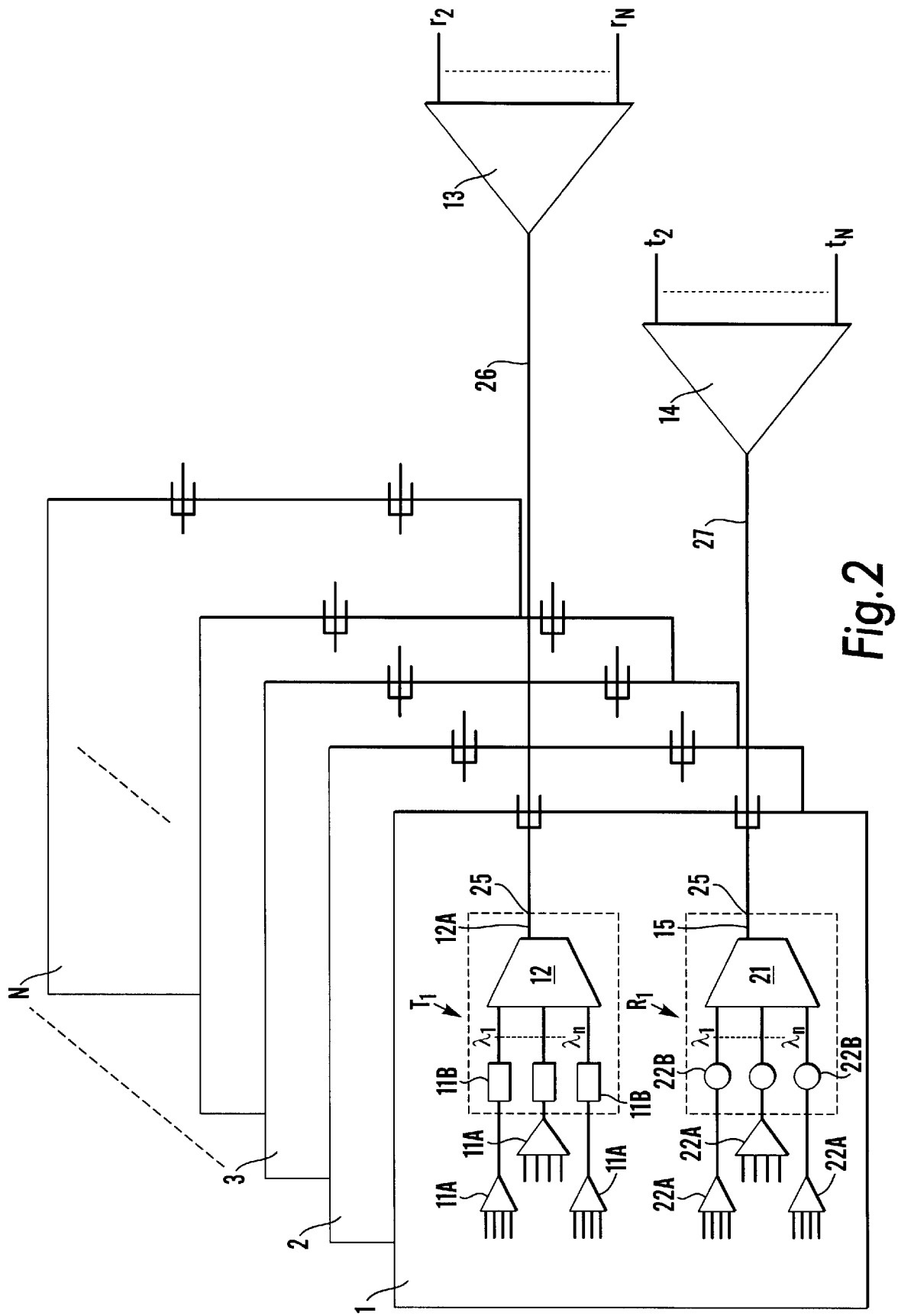
FIG. 2 is a schematic diagram of an optical switch fabric comprising apparatus according to a second embodiment of the invention.

FIG. 2 shows another arrangement in which the splitter means 13 and the selecting means 14 are provided on an integrated circuit or integrated circuits, separate from the other components of the transmitter and receiver modules. The components shown in FIG. 2 are similar to those of FIG. 1 and the same reference numerals are used therein. The outputs $r_2$–$r_n$ of the splitter means 13 associated with the first electrical circuit board 1 would again be connected to the receiver modules $R_2$–$R_N$ on circuit boards 2 to N and the inputs $t_2$–$t_N$ of the selecting means 14 associated with the first electrical circuit board 1 connected to the transmitter modules $T_2$–$T_N$ on circuit boards 2–N by optical fibres forming an optical back plane as in the arrangement shown in FIG. 1.

In the arrangement shown in FIG. 2, the number of optical fibre links to the optical circuits on the electrical circuit boards 1–N is thus significantly reduced.

In the arrangement shown In FIG. 2 the N optical splitters 13 associated with the N transmitter modules may be formed on a single chip. Similarly, the N selecting means 14 associated with the N receiver modules may be formed on a single chip. If N is relatively small, the N optical splitters and N selecting means may also all be formed on the same chip and the connections between their respective outputs and inputs provided by integrated waveguides on the chip rather than by optical fibres.

Integrated waveguides are referred to above for connecting the various components on the Integrated optical circuit (s). On SOI chips, these are preferably in the form of rib waveguides. Further details of these and of SOI chips are given in U.S. Pat. No. 5,757,986 referred to above.

The integration of components of the apparatus described above, particularly on a silicon-on-insulator chip or chips, provides significant advantages over conventional electrical solutions and provides a feasible way of using optical technology to provide the required interconnections between multiple circuit boards, with fabrication costs low enough to compete with the cost of electrical solutions.

What is claimed is:

1. Apparatus for use in connecting a plurality of electrical circuit boards so each electrical circuit board can communicate with each other electrical circuit board, the apparatus comprising an optical circuit for association with each electrical circuit board, each optical circuit comprising a transmitter module and a receiver module;

the transmitter module comprising:
a plurality of electrical to optical converter means for converting a plurality of electrical signals into a plurality of optical signals each of a different wavelength,
wavelength multiplexing means for multiplexing the optical signals of different wavelengths into a single optical waveguide, and
optical splitter means for dividing the multiplexed signal in the single optical waveguide into a plurality of identical signals for transmission to each of the receiver modules; and
the receiver module comprising:
optical selecting means for selecting signals from one or more of the transmitter modules,
wavelength demultiplexing means for demultiplexing the selected signal or signals into a plurality of signals each of a different wavelength, and
a plurality of optical to electrical converter means for converting each of the said plurality of signals of different wavelengths into an electrical signal;
wherein each optical circuit comprises one or more integrated optical circuits providing:
wavelength multiplexing means comprising integrated directing means for directing the plurality of optical signals of different wavelengths into a single integrated optical waveguide;
optical splitter means comprising an integrated optical waveguide which successively divides into a plurality of integrated optical waveguides;
optical selecting means comprising a plurality of integrated optical input waveguides leading to a single integrated output waveguide;
wavelength demultiplexing means comprising an integrated transmission or reflection grating for directing signals of different wavelengths to respective optical to electrical converter means.

2. Apparatus as claimed in claim 1 in which the integrated directing means comprises an integrated transmission or reflection grating.

3. Apparatus as claimed in claim 1 in which the transmission or reflection grating comprises a series of spaced apart recesses formed in the or a integrated optical circuit.

4. Apparatus as claimed in claim 1 in which the optical splitter means comprises a cascade of Y-junctions formed in the integrated optical waveguide.

5. Apparatus as claimed in claim 1 in which the optical selecting means comprises one or more Y-junctions for combining inputs from two or more waveguides.

6. Apparatus as claimed in claim 1 in which the optical selecting means comprise one or more optical switches for selecting which input waveguide(s) communicate(s) with the said single integrated output waveguide.

7. Apparatus as claimed in claim 6 in which the optical switches comprise evanescent couplers.

8. Apparatus as claimed in claim 7 in which an integrated beam dump is provided in communication with one output of each coupler.

9. Apparatus as claimed in claim 6 in which the optical switches are controlled by one or more PIN diode phase modulators.

10. Apparatus as claimed in claim 1 in which the or each integrated optical circuit is formed on one or more silicon-on-insulator chips.

11. Apparatus as claimed in claim 10 in which rib waveguides formed in the silicon layer of the or each silicon-on-insulator chip provide communication between one or more of the following: between the electrical to optical converter means and the wavelength multiplexing means, between the wavelength multiplexing means and the optical splitter means, between the optical selecting means and the wavelength demultiplexing means and between the wavelength demultiplexing means and the optical to electrical converter means.

12. Apparatus as claimed in claim 10 in which the electrical to optical converter means comprises laser diodes hybridised on a silicon-on-insulator chip.

13. Apparatus as claimed in claim 10 in which the optical to electrical converter means comprises photodiodes hybridised on a silicon-on-insulator chip.

14. Apparatus as claimed in claim 10 in which the transmitter module and/or the receiver module comprise grooves formed in a silicon-on-insulator chip for receiving optical fibers to connect the modules to an optical back plane.

15. Apparatus as claimed in claim 1 in which at least part of the electrical to optical converter means and the wavelength multiplexing means are provided on a first integrated optical circuit board.

16. Apparatus as claimed in claim 15 in which the optical splitter means is also provided on the first integrated optical circuit board.

17. Apparatus as claimed in claim 1 in which the wavelength demultiplexing means and at least part of the optical to electrical converter means are provided on a second integrated optical circuit board.

18. Apparatus as claimed in claim 17 in which the optical selecting means is also provided on the second integrated optical circuit board.

19. Apparatus as claimed in claim 1 in which the wavelength multiplexing means and the wavelength demultiplexing means are provided on the same integrated optical circuit board.

20. Apparatus as claimed in claim 19 in which the transmitter module and receiver module are combined as a transceiver using the same transmission or reflection grating as the multiplexing means and the demultiplexing means.

21. Apparatus as claimed in claim 1 in which the optical splitter means of each transmitter module are provided on an optical circuit board separate from an optical circuit board on which the wavelength multiplexing means is provided.

22. Apparatus as claimed in claim 21 in which the optical splitter means and the optical selecting means are provided on the same optical circuit board and connected to each other by integrated waveguides.

23. Apparatus as claimed in claim 1 in which the optical selecting means of each receiver module are provided on an optical circuit board separate from an optical circuit board on which the wavelength demultiplexing means is provided.

24. Apparatus as claimed in claim 1 comprising optical fibre connector means on the or each optical circuit for connecting the outputs of the transmitter module and the inputs of the receiver module to optical fibres providing communication with corresponding optical circuits associated with other electrical circuit boards.

25. Apparatus as claimed in claim 24 comprising combining means on the or each optical circuit, each combining means being connected to an optical fibre connector, to one output of the transmitter module and to one input of the receiver module, so as to enable bi-directional communication with the optical fibre.

26. Apparatus as claimed in claim 25 in which the combining means comprise Y-junctions.

27. Apparatus as claimed in claim 1 comprising electronic time division multiplexing means for providing time division multiplexed electrical signals to the electrical to optical converter means and electronic time division demultiplexing means for time division demultiplexing electrical signals received from the optical to electrical converter means.

28. A circuit, comprising:

a plurality of electrical circuit boards;

an optical circuit for association between the electrical circuit boards so that each electrical circuit board can communicate with two or more other electrical circuit boards, each optical circuit comprising a transmitter module and a receiver module;

the transmitter module comprising:
  a plurality of electrical to optical converter means for converting a plurality of electrical signals into a plurality of optical signals each of a different wavelength,
  wavelength multiplexing means for multiplexing the optical signals of a spectrum of wavelengths into a single optical waveguide, and
  optical splitter means for dividing the multiplexed signal in the single optical waveguide into a plurality of identical signals each with the spectrum of wavelengths for transmission to the receiver modules of one or more of the other electrical circuit boards; and the receiver module comprising:
  optical selecting means for selecting signals from one or more of the transmitter modules,
  wavelength demultiplexing means for demultiplexing the selected signal or signals into a plurality of signals each of a different wavelength of the spectrum, and
  a plurality of optical to electrical converter means for converting each of the said plurality of signals of the spectrum of wavelengths into an electrical signal;

wherein the optical circuit comprises one or more integrated optical circuits providing:
  wavelength multiplexing means comprising integrated directing means for directing the plurality of optical signals of the spectrum of wavelengths into a single integrated optical waveguide;
  optical splitter means comprising an integrated optical waveguide which successively divides into a plurality of integrated optical waveguides;
  optical selecting means comprising a plurality of integrated optical input waveguides leading to a single integrated output waveguide;
  wavelength demultiplexing means comprising an integrated transmission or reflection grating for directing signals of the spectrum of wavelengths to respective optical to electrical converter means.

29. Apparatus for use in connecting a plurality of electrical circuit boards, comprising:

an optical circuit for association with each of the electrical circuit boards, so each electrical circuit board selectively transmits data to each of two or more other electrical circuit boards, each optical circuit comprising a transmitter module and a receiver module;

the transmitter module comprising:
  a plurality of electrical to optical converter means for converting a plurality of electrical signals into a plurality of optical signals each of a different wavelength,
  wavelength multiplexing means for multiplexing the optical signals of different wavelengths into a single optical waveguide, and
  optical splitter means for dividing the multiplexed signal in the single optical waveguide into a plurality of identical signals for transmission to each of the receiver modules of the two or more other electrical circuit boards; and the receiver module comprising:
  optical selecting means for selecting signals from one or more of the transmitter modules of the two or more other electrical circuit boards;
  wavelength demultiplexing means for demultiplexing the selected signal or signals into a plurality of signals each of a different wavelength, and
  a plurality of optical to electrical converter means for converting each of the said plurality of signals of different wavelengths into an electrical signal, wherein the optical circuit comprises one or more integrated optical circuits providing:
  wavelength multiplexing means comprising integrated directing means for directing the plurality of optical signals of different wavelengths into a single integrated optical waveguide;
  optical splitter means comprising an integrated optical waveguide which successively divides into a plurality of integrated optical waveguides;
  optical selecting means comprising a plurality of integrated optical input waveguides leading to a single integrated output waveguide;
  wavelength demultiplexing means comprising an integrated transmission or reflection grating for directing signals of different wavelengths to respective optical to electrical converter means.

30. Apparatus as claimed in claim 29, wherein the two or more other electrical circuit boards comprise a matrix arrangement of rows and columns, wherein each row and column comprises two or more other electrical boards, and wherein said each electrical circuit board selectively receives the data from said each of two or more other electrical circuit boards.

* * * * *